US006059170A

United States Patent [19]
Jimarez et al.

[11] Patent Number: 6,059,170
[45] Date of Patent: May 9, 2000

[54] METHOD AND APPARATUS FOR INSULATING MOISTURE SENSITIVE PBGA'S

[75] Inventors: Lisa J. Jimarez, Newark Valley; Craig G. Heim, Kirkwood, both of N.Y.

[73] Assignee: International Business Machines Corporation, Armonk, N.Y.

[21] Appl. No.: 09/104,572

[22] Filed: Jun. 24, 1998

[51] Int. Cl.[7] .............................. B23K 31/00; B23K 1/00; B23K 1/018
[52] U.S. Cl. ......................... 228/119; 228/46; 228/234.1; 228/264
[58] Field of Search .............................. 228/119, 180.22, 228/222, 234.1, 264, 46, 53

[56] References Cited

U.S. PATENT DOCUMENTS

| | | |
|---|---|---|
| 4,441,647 | 4/1984 | Holmes . |
| 4,481,708 | 11/1984 | Bokil et al. . |
| 4,771,929 | 9/1988 | Bahr et al. . |
| 5,395,040 | 3/1995 | Holzmann ............................. 228/254 |
| 5,516,030 | 5/1996 | Denton .............................. 228/180.22 |
| 5,560,531 | 10/1996 | Ruszowski ................................. 228/19 |
| 5,598,965 | 2/1997 | Scheu ....................................... 228/6.2 |
| 5,641,114 | 6/1997 | Horton et al. . |
| 5,735,450 | 4/1998 | Heim et al. ............................... 228/191 |
| 5,785,237 | 7/1998 | Lasto et al. ......................... 228/180.22 |
| 5,826,779 | 10/1998 | Jacks et al. ................................ 228/42 |
| 5,862,588 | 1/1999 | Heim et al. ................................ 29/840 |
| 5,878,942 | 3/1999 | Kodama et al. ..................... 228/180.22 |

OTHER PUBLICATIONS

"Thermal Component Shrouds for I.R. Reflow Component Thermal Protection" (1991) *Research Disclosure 328*: 32802.

"Enhanced IR Reflow Process Using Reflective Caps" (1992) *Research Disclosure 335*: 33542.

*Primary Examiner*—Patrick Ryan
*Assistant Examiner*—Kiley Stoner
*Attorney, Agent, or Firm*—Scully, Scott, Murphy, Presser

[57] ABSTRACT

Method and apparatus removing a component having a solder ball grid array to a circuitized substrate. The solder balls have a first temperature at which they melt. The component has a second temperature, greater than the first temperature, over which the component is damaged. The method has a step of placing a thermal shield over the component. In a next step, the circuitized substrate and the component having the solder ball grid array are heated to a third temperature lower than the first temperature. In a next step, a stream of hot gas of a fourth temperature is directed for a predetermined time about the periphery of the thermal shield such that the solder balls reach the first temperature thereby reflowing the solder joints or balls, while other parts of the component reach less than the second temperature. At this point, the component is either attached to the circuitized substrate or permitted to be removed therefrom. Similar methods are also provided for attaching a component having a solder ball grid array from a circuitized substrate.

48 Claims, 4 Drawing Sheets

METHOD AND APPARATUS FOR INSULATING MOISTURE SENSITIVE PBGA'S

BACKGROUND OF THE INVENTION

1. Field of the Invention

The field of art to which this invention relates is electronic packaging. More specifically, this invention relates to a method and apparatus for insulating moisture sensitive plastic ball grid array (PBGA) modules during attachment or removal from circuitized substrates.

2. Description of the Related Art

Typically, one or more semiconductor chips, or other such electronic devices, are mounted on a first circuitized substrate (called a semiconductor chip carrier, or more generally, a first level electronic package or module), which, in turn, is mounted on a second circuitized substrate such as a printed circuit card or board (PCB) (more generally called a second level electronic package or module). The electronic devices mounted on the first level electronic module are electrically connected through the circuitry of the first level module to the circuitry of the second electronic module. The resulting structure may be used as part of a computer or other such equipment.

A semiconductor chip, or other such electronic device, may be mounted on pads, which are part of the circuitry formed on the chip carrier. Conventional techniques are used to mount the chip carrier to the semiconductor chip. One such technique is called solder reflow which uses solder bumps, such as solder balls corresponding to the pads. With each contact pad on the chip carrier being positioned on the appropriate solder bump on the chip, the assembly is heated so as to liquefy the solder and bond each contact pad on the chip carrier to the confronting solder bump on the chip. The pads and bumps, or balls, are typically positioned in an area array called a ball grid array (BGA). The chip, chip carrier and BGA together form the first level electronic package, or module. The first level module is then attached to a PCB in much the same way, using a grid of solder balls corresponding to an array of conductive pads on the PCB.

Plastic ball grid array (PBGA) modules are moisture sensitive. The specification for attaching or removing PBGA's from PCB's requires that the solder balls on the bottom side of the PBGA reach approximately 200° C. while a cover plate on top of the chip cannot exceed 220° C. during reflow to attach a placed good PBGA or to remove a defective PBGA from the PCB. Exposure to a temperature exceeding 220° C. can result in damage to the chip.

Difficulty arises because of the design limitations of the rework tool used in such procedures. The printed circuit board (PCB) is placed in a bias bay that heats the PCB and its first level modules somewhere between room temperature and 135° C. The bias bay is limited to heating a PCB up to 150° C. uniformly. In order to heat the solder joints (in the case of removal) or solder balls (in the case of attachment) between the PBGA and the PCB, hot gas must be applied to the top side of the PBGA. The hot gas temperature required is a minimum of 230° C.

The problem arises because a cover plate affixed on the PBGA is the first part of the structure that sees the hot gas. While the solder joints, or balls to be melted are many layers below in the structure. The tool design makes it impossible to heat the solder joints, or balls to 200° C. while maintaining the cover plate temperature below 220° C. Double sided product (PBGA's on both the top and bottom of the card) increase the difficulty in reworking the site. Additionally, because of the hot gas flow across the chip, the solder balls joining the chip to the carrier on the first level module can reflow during attachment or removal of the first level module to the PCB. This can cause opens between the chip and carrier or excessive intermetallic growth that will eventually lead to solder joint failure.

SUMMARY OF THE INVENTION

Therefore, it is an object of the present invention to provide a method and structure for insulating moisture sensitive PBGA's during removal or attachment which protects the chip from damage caused by exposure to high temperatures.

It is yet another object of the present invention to provide a method and structure for insulating moisture sensitive PBGA's during removal or attachment which prevents reflow of the solder balls of the first level module during attachment or removal of the first level module.

Accordingly, a method for attaching a component having a solder ball grid array to a circuitized substrate is provided. The solder balls have a first temperature at which they melt. The component has a second temperature, greater than the first temperature, over which the component is damaged. The method comprises a first step of preheating the circuitized substrate to a third temperature lower than the first temperature. In a second step, the component is placed on the circuitized substrate. In a third step, a thermal shield is placed over the component. In a fourth step, a stream of hot gas of a fourth temperature is directed for a predetermined time about the periphery of the thermal shield such that the solder balls reach the first temperature thereby forming solder joints, while other parts of the component reach less than the second temperature.

Similarly, a method for removing a component having a solder joint grid array from a circuitized substrate is also provided. This method comprises a first step of placing a thermal shield over the component. In a second step the circuitized substrate and the component having the solder joint grid array are heated to a third temperature lower than the first temperature. In a third step, a stream of hot gas of a fourth temperature is directed for a predetermined time about the periphery of the thermal shield such that the solder joints reach the first temperature thereby breaking the solder joints, while other parts of the component reach less than the second temperature. In a fourth step, the component is removed from the circuitized substrate.

Also provided herein is an apparatus for attaching a component having a solder ball grid array to a circuitized substrate wherein the apparatus comprises means for placing the component on the circuitized substrate; a thermal shield disposed over the component; means for preheating the circuitized substrate to a third temperature lower than the first temperature; and means for directing a stream of hot gas of a fourth temperature for a predetermined time about the periphery of the thermal shield such that the solder balls reach the first temperature thereby forming solder joints, while other parts of the component reach less than the second temperature.

Similarly, an apparatus for removing a component having a solder joint grid array from a circuitized substrate is also provided.

This apparatus comprises a thermal shield disposed over the component; means for preheating the circuitized substrate and the component having the solder joint grid array to a third temperature lower than the first temperature;

means for directing a stream of hot gas of a fourth temperature for a predetermined time about the periphery of the component with the thermal shield such that the solder joints reach the first temperature thereby breaking the solder joints, while other parts of the component reach less than the second temperature; and means for removing the component from the circuitized substrate.

In preferred versions of the methods and apparatus of the present invention, the circuitized substrate is a printed circuit board, and the component is a semiconductor chip and chip carrier module.

BRIEF DESCRIPTION OF THE DRAWINGS

These and other features, aspects, and advantages of the apparatus and methods of the present invention will become better understood with regard to the following description, appended claims, and accompanying drawings where:

DETAILED DESCRIPTION OF THE PREFERRED EMBODIMENTS

Although this invention is applicable to numerous and various types of components and circuitized substrates it has been found particularly useful in the environment of printed circuit boards and semiconductor chip and chip carrier modules. Therefore, without limiting the applicability of the invention to printed circuit boards and semiconductor chip and chip carrier modules, the invention will be described in such environment.

Figure 1:
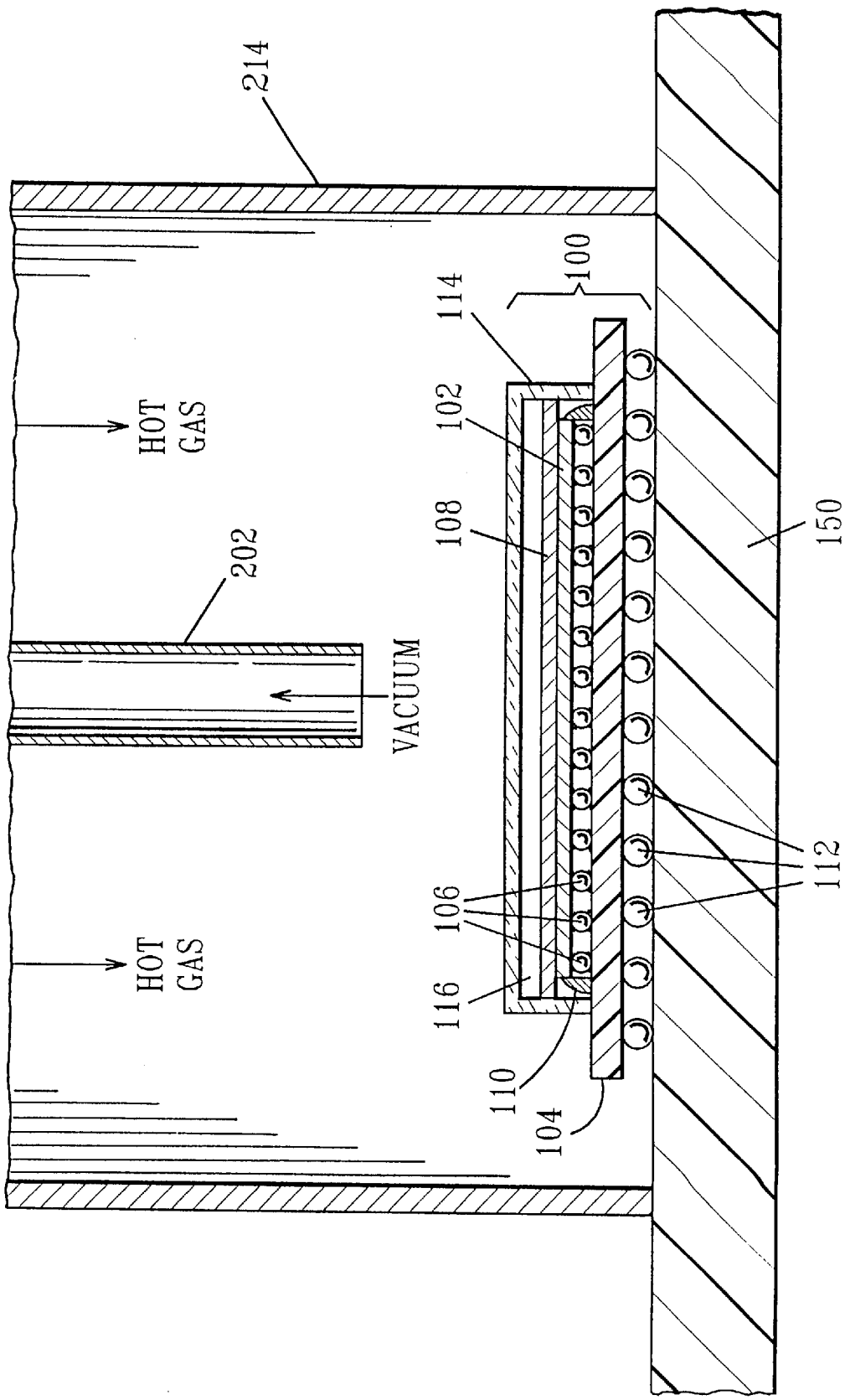
FIG. 1 illustrates a sectional view of the PBGA module of the present invention.

Referring now to FIG. 1, there is shown a PBGA module, referred to generally by reference numeral 100, and alternatively referred to as a component. The component 100 sits atop a circuitized substrate 150, preferably a PCB. The component 100 has a semiconductor chip 102 attached to a chip carrier 104 by means of a first BGA 106 by processes well known in the art, such as a C4 process. The semiconductor chip 102 and chip carrier 104 make up a first level package or module. The first level module preferably also has a cover plate 108 affixed to the semiconductor chip 102, preferably made from stainless steel for mechanical reliability of the chip, thermal barrier, and physical appearance. The first level module preferably also has an underfill 110, which is preferably an epoxy with a filler for reducing the mechanical stresses in the solder joints between the first solder balls 106 and their corresponding conductive pads (not shown) on the chip carrier 104.

The component 100 also includes a second ball grid array 112 affixed to the chip carrier 104 and arranged such that the individual solder balls that make up the second BGA 112 correspond to solder pads (not shown) on the circuitized substrate 150, preferably a PCB. The second solder balls 112, have a first temperature at which they melt, preferably 200° C. The semiconductor chip 102 has a second temperature, greater than the first temperature, over which it can become damaged. Preferably the second temperature is no greater than 220° C.

Before reflowing the second solder balls 112, thereby joining the component 100 to the PCB 150, a thermal shield 114 is placed over the component 100. The thermal shield 114 insulates the cover plate 108 on the component 100 and prevents hot gas used to reflow the second BGA 112 (discussed below) from heating the cover plate 108 during reflow of the second BGA 112. The thermal shield 114 is preferably silicone and designed so that it is larger than the cover plate 108, but not too much larger so that it does not cover too much of the carrier 104. It is important that the chip carrier 104 be exposed to the hot gas during processing for uniform heating of the second BGA 112. Preferably, the thermal shield 114 is fabricated such that an air gap 116 exists between the component 100, and more specifically, the cover plate 108, and the thermal shield 114, for improving the thermal insulation provided therebetween. It should be readily apparent to one skilled in the art that the thermal shield 114 of the present invention can be utilized for both attachment and removal of an already attached component 100 from the PCB 150.

Figure 2:
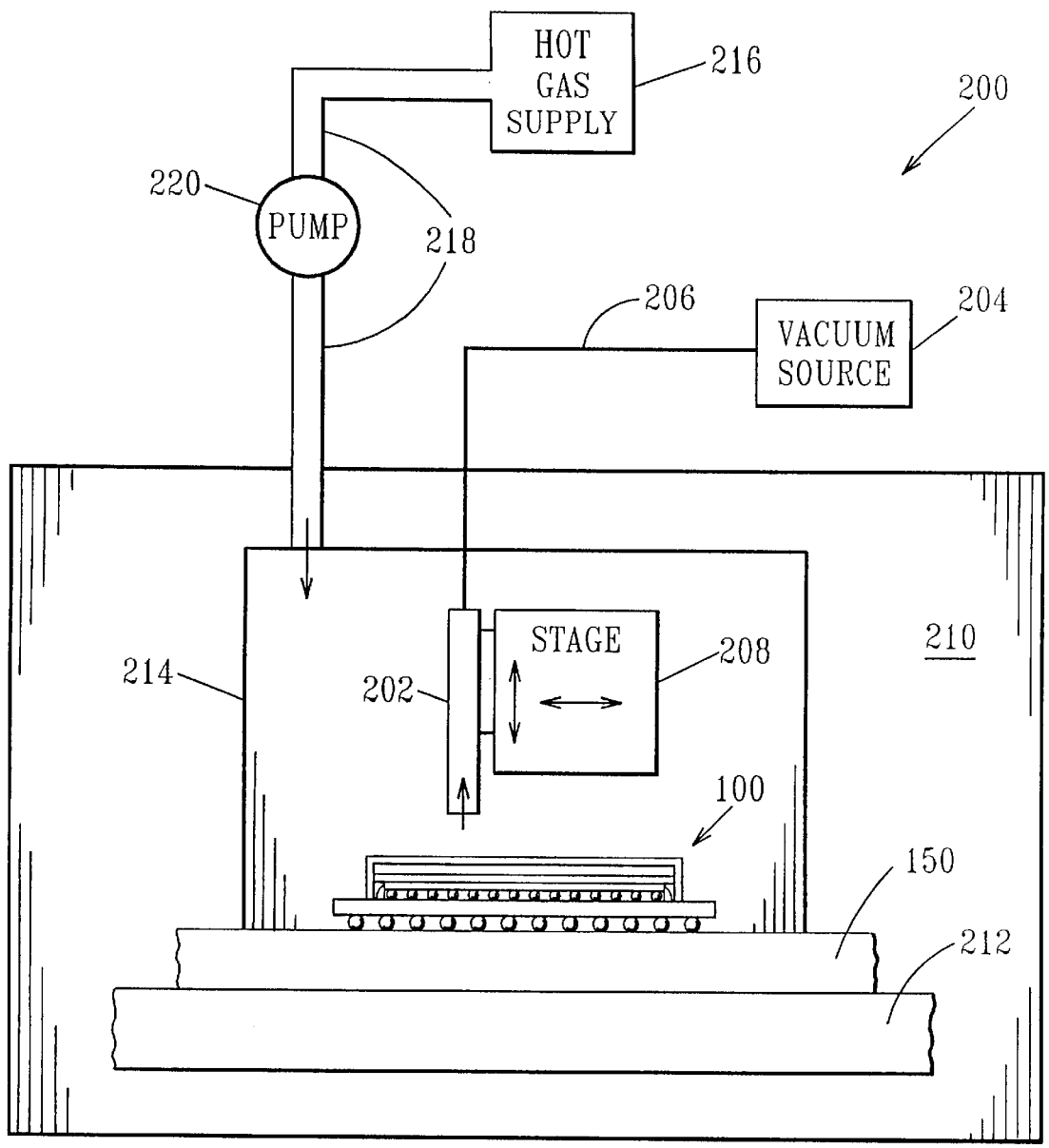
FIG. 2 illustrates a schematic of the PBGA apparatus of the present invention.

An apparatus of the present invention will now be described with regard to FIG. 2, the apparatus of FIG. 2 being generally referred to by reference numeral 200 and having the purpose of attaching the component 100 to the circuitized substrate 150. A means for placing the component 100 onto the circuitized substrate 150 is provided, preferably a vacuum tube 202 which is connected to a vacuum source 204 by way of a suitable conduit 206. With the application of a vacuum, the vacuum tube contacts the component 100 thereby holding the component under the aspirating effect of the vacuum. The component 100 is then lowered onto the circuitized substrate 150 in such a position that the conductive pads of the circuitized substrate 150 are aligned with the corresponding solder balls of the second BGA 112 of the component 100. Preferably, the component is lowered and aligned by way of a stage 208 which is fed alignment information from an alignment system. The alignment system is like those commonly employed in the art, such as two point camera vision or split optic systems.

Also provided in apparatus 200 is a means for preheating the circuitized substrate 150 to a third temperature which is lower than the first temperature. The preheating is done to reduce thermal stresses in the PCB 150 and to minimize any warpage of the same. The third temperature is preferably 135° C. Preferably, the PCB 150 can be placed in contact with a body 212 having a fifth temperature, higher than the third temperature, such that conductive heat transfer between the body 212 and PCB 150 results in the PCB 150 obtaining the third temperature. Alternatively, the preheating is achieved by placing the component 100 and PCB 150 in a heated environment 210, such as a bias bay, in which the component 100 and PCB 150 are allowed to slowly achieve the 135° C. temperature at which the heated environment 210 is maintained A means is provided for directing a stream of hot gas of a fourth temperature for a predetermined time about the periphery of the thermal shield such that the second BGA 112 reaches the first temperature (at which they melt) thereby forming solder joints joining the component 100 to the PCB 150, while the other parts of the component 100, namely the chip 102 and the first BGA 106, reach less than the second temperature (at which the chip can be damaged). The fourth temperature is preferably greater than 230° C. and more preferably 260° C.

Preferably, the means for directing the stream of hot gas comprises a nozzle 214 which surrounds the component 100 and makes contact with the PCB 150. Hot gas is supplied from a hot gas supply 216 and supplied to the nozzle by way of a suitable conduit 218 and a pump 220, if necessary, disposed in the conduit 218 for delivering the hot gas from the supply 216, through the nozzle 214 and ultimately across the component 100. Alternatively, the hot gas supply 216 can be pressurized, in which case a pump 220 is not needed to deliver the gas to the component 100.

It should be appreciated by one skilled in the art, that the same apparatus can also be utilized for the removal of the component 100 from the circuitized substrate 150. In such a configuration, upon the direction of the hot gas across the component 100, instead of forming solder joints, the solder joints already formed reflow, allowing one to break the solder joints by removing the component 100 from the PCB 150. The removal of the component 100 from the PCB 150 can be done using the same vacuum tube 202 and stage 208 as discussed previously. After reflow of the solder joints, the vacuum tube 202 is lowered to contact the component 100, by means of the stage 208, and thereafter lifted from the PCB 150 under the aspiration effect of the vacuum. Of course, in this situation, an alignment system for aligning the BGA's to their corresponding pads is not necessary.

Figure 3:
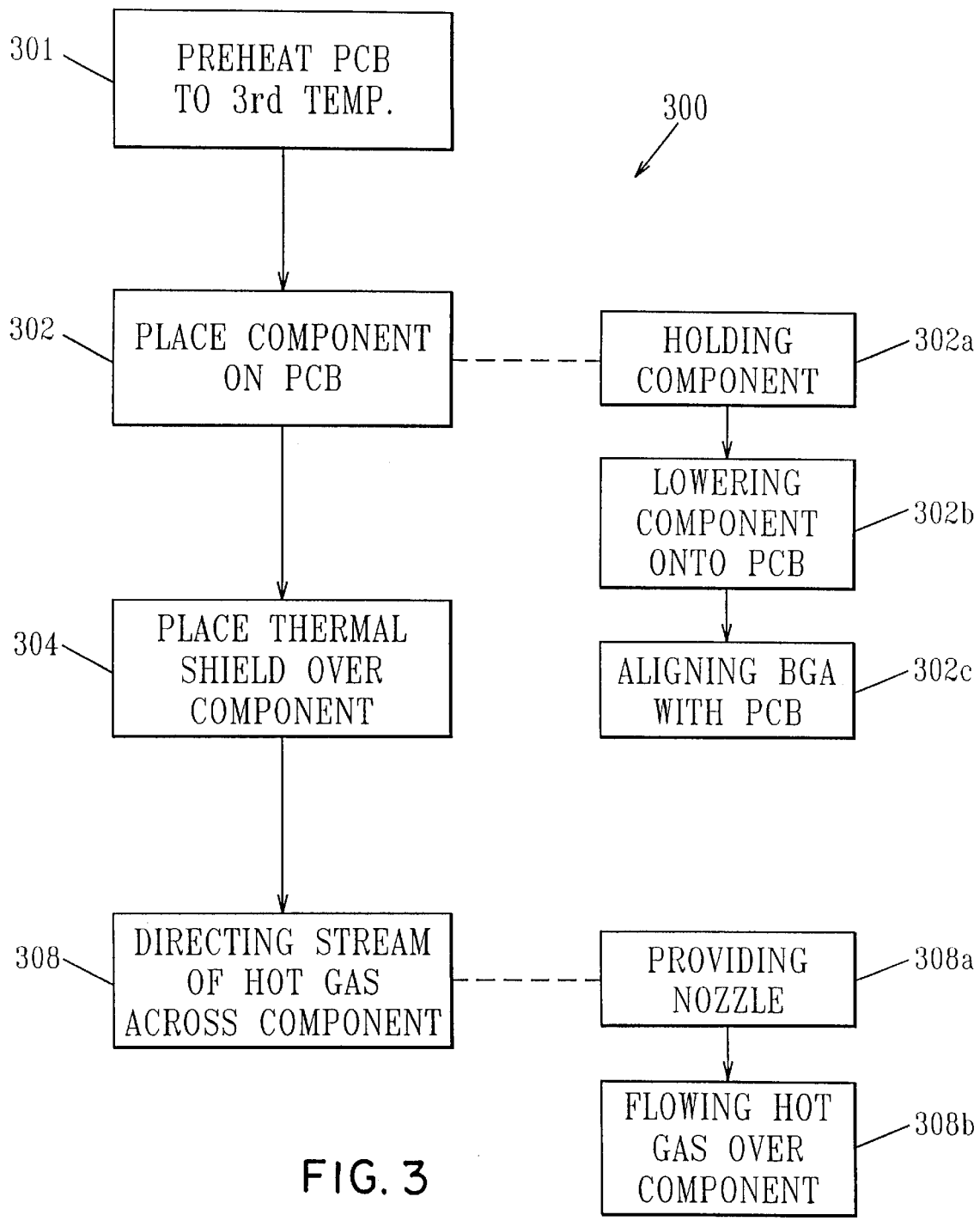
FIG. 3 illustrates a flow diagram of a method of the present invention in which a component is attached to a circuitized substrate.
Figure 4:
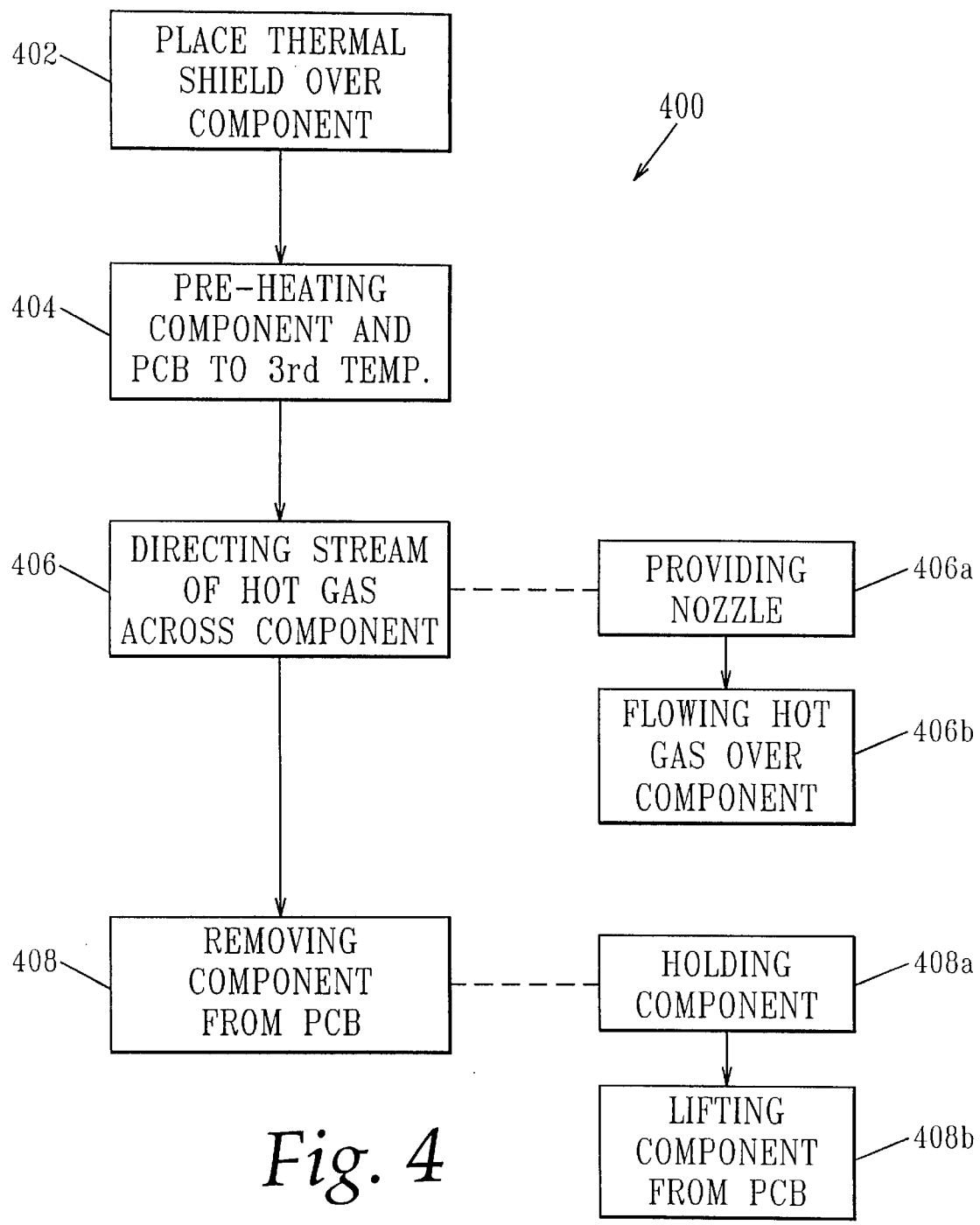
FIG. 4 illustrates a flow diagram of a method of the present invention in which a component is removed from a circuitized substrate.

In summary, the steps of the methods of the present invention are outlined in the flowcharts illustrated in FIGS. 3 and 4. FIG. 3 illustrates a method for attaching the component 100 to the PCB 150, while FIG. 4 illustrates a method for removing the component 100 from the PCB 150.

Referring now to FIG. 3, there is illustrated a flowchart for a method for attaching a component to a PCB, the method generally referred to by reference numeral 300. At step 301 the circuitized substrate 150 is pre-heated to the third temperature as previously described. At step 302 the component 100 is placed on the circuitized substrate 150. This is preferably achieved by sub-steps 302a–302c. At step 302a the component is held or grasped for placement, at step 302b the held component is lowered onto the circuitized substrate, and at step 302c the second BGA 112 is aligned to the corresponding conductive pad array on the circuitized substrate 150.

At step 304 a thermal shield 114, as previously described is placed over the component 100. At step 308, the stream of hot gas is directed for a predetermined time about the periphery of the thermal shield 114 such that the second BGA 112 reaches the first temperature thereby forming solder joints. Preferably step 308 is carried out by way of sub-steps 308a and 308b. Step 308a comprises the providing of the nozzle 214 over the component 100 and step 308b comprises the flowing of hot gas through the nozzle and over the component 100.

Referring now to FIG. 4, there is illustrated a flowchart for a method for removing a component from a PCB, the method generally referred to by reference numeral 400.

At step 402 the thermal shield 114, as previously described is placed over the component 100. At step 404 the circuitized substrate 150 and the component 100 are pre-heated to the third temperature as previously described. At step 406, the stream of hot gas is directed for a predetermined time about the periphery of the thermal shield 114 such that the second BGA 112 reaches the first temperature thereby breaking the solder joints. Preferably step 406 is carried out by way of sub-steps 406a and 406b. Step 406a comprises the providing of the nozzle 214 over the component 100 and step 406b comprises the flowing of hot gas through the nozzle and over the component 100. At step 408 the component 100, after the solder joints between the component 100 and the PCB 150 have been broken, is removed from the circuitized substrate 150. This is preferably achieved by sub-steps 408a and 408b. At step 408a the component is held or grasped for removal, at step 408b the held component is lifted from the circuitized substrate.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A method for attaching a component having a solder ball grid array to a circuitized substrate, the solder balls having a first temperature at which they melt, the component having a second temperature, greater than the first temperature, over which the component is damaged, the method comprising the steps of:

(a) preheating the circuitized substrate to a third temperature lower than the first temperature, (b) placing the component on the circuitized substrate, (c) placing a thermal shield over the component, and (d) directing a stream of hot gas of a fourth temperature for a predetermined time about the periphery of the thermal shield such that the solder balls reach the first temperature thereby forming solder joints, while other parts of the component reach less than the second temperature.

2. The method of claim 1, wherein step (b) comprises the sub-steps of:

(i) holding the component, (ii) lowering the held component onto the circuitized substrate, and (iii) aligning the ball grid array to a corresponding conductive pad array on the circuitized substrate.

3. The method of claim 1, wherein step (c) further comprises the sub-step of supplying an air gap between the component and the thermal shield for improving the thermal insulation provided by the thermal shield.

4. The method of claim 1, wherein step (a) comprises placing the substrate in a heated environment having the third temperature.

5. The method of claim 1, wherein step (a) comprises placing a body having a fifth temperature, higher than the third temperature, in contact with the substrate such that conductive heat transfer between the body and substrate results in the substrate obtaining the third temperature.

6. The method of claim 1, wherein step (d) further comprises the sub-steps of:

(i) providing a nozzle over the component, and (ii) flowing the hot gas through the nozzle and over the component.

7. The method of claim 1, wherein the circuitized substrate is a printed circuit board.

8. The method of claim 1, wherein the component is a semiconductor chip and chip carrier module.

9. The method of claim 1, wherein the first temperature is 200 degrees Celsius, the second temperature is 220 degrees Celsius, the third temperature is 135 degrees Celsius, and the fourth temperature is greater than 230 degrees Celsius.

10. The method of claim 9, wherein the fourth temperature is 260 degrees Celsius.

11. A method for removing a component having a solder joint grid array from a circuitized substrate, the solder joints having a first temperature at which they melt, the component having a second temperature, greater than the first temperature, over which the component is damaged, the method comprising the steps of:

(a) placing a thermal shield over the component, (b) preheating the circuitized substrate and the component having the solder joint grid array to a third temperature lower than the first temperature, (c) directing a stream of hot gas of a fourth temperature for a predetermined time about the periphery of the thermal shield such that the solder joints reach the first temperature thereby breaking the solder joints, while other parts of the component reach less than the second temperature, and (d) removing the component from the circuitized substrate.

12. The method of claim 11, wherein step (d) comprises the sub-steps of:

(i) holding the component, and (ii) lifting the held component from the circuitized substrate.

13. The method of claim 11, wherein step (a) further comprises the sub-step of supplying an air gap between the component and the thermal shield for improving the thermal insulation provided by the thermal shield.

14. The method of claim 11, wherein step (b) comprises placing the substrate in a heated environment having the third temperature.

15. The method of claim 11, wherein step (b) comprises placing a body having a fifth temperature, higher than the third temperature, in contact with the substrate such that conductive heat transfer between the body and substrate results in the substrate obtaining the third temperature.

16. The method of claim 11, wherein step (c) further comprises the sub-steps of:

(i) providing a nozzle over the component, and (ii) flowing the hot gas through the nozzle and over the component.

17. The method of claim 11, wherein the circuitized substrate is a printed circuit board.

18. The method of claim 11, wherein the component is a semiconductor chip and chip carrier module.

19. The method of claim 11, wherein the first temperature is 200 degrees Celsius, the second temperature is 220 degrees Celsius, the third temperature is 135 degrees Celsius, and the fourth temperature is greater than 230 degrees Celsius.

20. The method of claim 19, wherein the fourth temperature is 260 degrees Celsius.

21. An apparatus for attaching a component having a solder ball grid array to a circuitized substrate, the solder balls having a first temperature at which they melt, the component having a second temperature, greater than the first temperature, over which the component is damaged, the apparatus comprising:

means for preheating the circuitized substrate to a third temperature lower than the first temperature, means for placing the component on the circuitized substrate, a thermal shield disposed over the component, and means for directing a stream of hot gas of a fourth temperature for a predetermined time about the periphery of the thermal shield such that the solder balls reach the first temperature thereby forming solder joints, while other parts of the component reach less than the second temperature.

22. The apparatus of claim 21, wherein the means for placing the component on the circuitized substrate comprises:

means for holding the component, means for lowering the held component onto the circuitized substrate, and means for aligning the ball grid array to a corresponding conductive pad array on the circuitized substrate.

23. The apparatus of claim 22, wherein the means for holding the component comprises a vacuum tube in contact with the component for holding the component under the aspiration effect of a vacuum applied thereto.

24. The apparatus of claim 23, wherein the means for lowering the held component onto the circuitized substrate comprises a stage affixed to the vacuum tube and capable of movement in at least the direction in which the component is lowered.

25. The apparatus of claim 22, wherein the means for aligning the ball grid array to the corresponding conductive pad array on the circuitized substrate comprises a two point vision camera.

26. The apparatus of claim 22, wherein the means for aligning the ball grid array to the corresponding conductive pad array on the circuitized substrate comprises a split optic system.

27. The apparatus of claim 21, further comprising an air gap between the component and the thermal shield for improving the thermal insulation provided by the thermal shield.

28. The apparatus of claim 21, wherein the means for preheating the circuitized substrate comprises a heated environment having the third temperature in which the circuitized substrate is placed.

29. The apparatus of claim 21, wherein the means for preheating the circuitized substrate comprises a body having a fifth temperature, higher than the third temperature, placed in contact with the substrate such that conductive heat transfer between the body and substrate results in the substrate obtaining the third temperature.

30. The apparatus of claim 21, wherein the means for directing the stream of hot gas further comprises:

a nozzle disposed over the component, and means for flowing the hot gas through the nozzle and over the component.

31. The apparatus of claim 30, wherein the means for flowing the hot gas through the nozzle and over the component comprises a supply of hot gas, a conduit connecting the hot gas supply with the nozzle, and a pump disposed in the conduit for delivering the hot gas from the supply, through the nozzle, and to the component.

32. The apparatus of claim 21, wherein the circuitized substrate is a printed circuit board.

33. The method of claim 21, wherein the component is a semiconductor chip and chip carrier module.

34. The apparatus of claim 21, wherein the first temperature is 200 degrees Celsius, the second temperature is 220 degrees Celsius, the third temperature is 135 degrees Celsius, and the fourth temperature is greater than 230 degrees Celsius.

35. The apparatus of claim 34, wherein the fourth temperature is 260 degrees Celsius.

36. An apparatus for removing a component having a solder joint grid array from a circuitized substrate, the solder joints having a first temperature at which the solder melts, the component having a second temperature, greater than the first temperature, over which the component is damaged, the apparatus comprising:

a thermal shield disposed over the component, means for preheating the circuitized substrate and the component having the solder joint grid array to a third temperature lower than the first temperature, means for directing a stream of hot gas of a fourth temperature for a predetermined time about the periphery of the component with the thermal shield such that the solder joints reach the first temperature thereby breaking the solder joints, while other parts of the component reach less than the second temperature, and means for removing the component from the circuitized substrate.

37. The apparatus of claim 36, wherein the means for removing the component from the circuitized substrate comprises:

means for holding the component, and means for raising the held component from the circuitized substrate.

38. The apparatus of claim 37, wherein the means for holding the component comprises a vacuum tube in contact with the component for holding the component under the aspiration effect of a vacuum applied thereto.

39. The apparatus of claim 38, wherein the means for raising the held component from the circuitized substrate comprises a stage affixed to the vacuum tube and capable of movement in at least the direction in which the component is raised.

40. The apparatus of claim 36, further comprising an air gap between the component and the thermal shield for improving the thermal insulation provided by the thermal shield.

41. The apparatus of claim 36, wherein the means for preheating the circuitized substrate and the component comprises a heated environment having the third temperature in which the circuitized substrate and component are placed.

42. The apparatus of claim 36, wherein the means for preheating the circuitized substrate comprises a body having a fifth temperature, higher than the third temperature, placed in contact with the substrate such that conductive heat transfer between the body and substrate results in the substrate obtaining the third temperature.

43. The apparatus of claim 36, wherein the means for directing the stream of hot gas further comprises:

a nozzle disposed over the component, and means for flowing the hot gas through the nozzle and over the component.

44. The apparatus of claim 43, wherein the means for flowing the hot gas through the nozzle and over the component comprises a supply of hot gas, a conduit connecting the hot gas supply with the nozzle, and a pump disposed in the conduit for delivering the hot gas from the supply, through the nozzle, and to the component.

45. The apparatus of claim 36, wherein the circuitized substrate is a printed circuit board.

46. The method of claim 36, wherein the component is a semiconductor chip and chip carrier module.

47. The apparatus of claim 36, wherein the first temperature is 200 degrees Celsius, the second temperature is 220 degrees Celsius, the third temperature is 135 degrees Celsius, and the fourth temperature is greater than 230 degrees Celsius.

48. The apparatus of claim 47, wherein the fourth temperature is 260 degrees Celsius.

* * * * *